United States Patent
Subramanian et al.

(10) Patent No.: US 9,442,475 B2
(45) Date of Patent: Sep. 13, 2016

(54) METHOD AND SYSTEM TO UNIFY AND DISPLAY SIMULATION AND REAL-TIME PLANT DATA FOR PROBLEM-SOLVING

(71) Applicant: Aspen Technology, Inc., Burlington, MA (US)

(72) Inventors: Ashok R. Subramanian, Cambridge, MA (US); Simon Lingard, Lexington, MA (US); Yoshio Yamashita, Boston, MA (US)

(73) Assignee: Aspen Technology, Inc., Bedford, MA (US)

( * ) Notice: Subject to any disclaimer, the term of this patent is extended or adjusted under 35 U.S.C. 154(b) by 748 days.

(21) Appl. No.: 13/875,680

(22) Filed: May 2, 2013

(65) Prior Publication Data
US 2014/0330542 A1 Nov. 6, 2014

(51) Int. Cl.
G06G 7/48 (2006.01)
G05B 17/02 (2006.01)
G06F 17/50 (2006.01)

(52) U.S. Cl.
CPC ........... *G05B 17/02* (2013.01); *G06F 17/5009* (2013.01); *G05B 2219/23445* (2013.01)

(58) Field of Classification Search
CPC ......................... G05B 17/02; G06F 17/30371
See application file for complete search history.

(56) References Cited

U.S. PATENT DOCUMENTS

| | | |
|---|---|---|
| D403,673 S | 1/1999 | Arora et al. |
| D420,995 S | 2/2000 | Imamura et al. |
| D451,928 S | 12/2001 | Van Huong |
| D454,138 S | 3/2002 | Imamura et al. |
| D462,695 S | 9/2002 | Van Huong |
| D500,766 S | 1/2005 | Hanisch et al. |
| D592,223 S | 5/2009 | Neuhaus |
| D593,120 S | 5/2009 | Bouchard et al. |
| D598,468 S | 8/2009 | Hirsch et al. |
| D606,091 S | 12/2009 | O'Donnell et al. |
| D607,007 S | 12/2009 | Kocmick |

(Continued)

OTHER PUBLICATIONS

Hashiguchi et al. "Wide-area Integrated SCADA System Designed to Improve. Availability and Flexibility", Hitachi Review vol. 60 (2011), No. 7 399.*

(Continued)

*Primary Examiner* — Aniss Chad
(74) *Attorney, Agent, or Firm* — Hamilton, Brook, Smith & Reynolds, P.C.

(57) ABSTRACT

A computer-based method and system brings together data from two business domains: real-time actual plant status operation data and predictive process simulation data based upon a design specification. This method and system correlates the plant data and the simulation data, and displays the results side-by-side for the user. The results assist the user, to determine whether the plant is operating properly, and to make further improvements to both the plant assets and to the simulation models. The invention assists with monitoring, maintaining, trouble shooting, and problem solving of plant operation. The invention facilitates a progressive visual collaborative environment between plant operation and process engineering teams, where engineers from respective domains may socialize and trouble shoot problems. The Progressive Visual Collaboration helps professionals with searching, sharing, mapping, analyzing, framing problems, removing ambiguity and uncertainty by considering facts and figures, and providing a progressive workflow that solves plant problems.

28 Claims, 12 Drawing Sheets

(56) References Cited

U.S. PATENT DOCUMENTS

| | | |
|---|---|---|
| D614,192 S | 4/2010 | Takano et al. |
| D624,928 S | 10/2010 | Agnetta et al. |
| D628,584 S | 12/2010 | Umezawa |
| D629,410 S | 12/2010 | Ray et al. |
| D657,377 S | 4/2012 | Vance et al. |
| D658,204 S | 4/2012 | Jones |
| D660,313 S | 5/2012 | Williams et al. |
| D661,369 S | 6/2012 | Nelson |
| D674,405 S | 1/2013 | Guastella et al. |
| D678,320 S | 3/2013 | Kanalakis, Jr. et al. |
| D678,894 S | 3/2013 | Kanalakis, Jr. et al. |
| D678,895 S | 3/2013 | Ebler et al. |
| D681,663 S | 5/2013 | Phelan et al. |
| D681,664 S | 5/2013 | Phelan et al. |
| D681,667 S | 5/2013 | Phelan |
| D682,293 S | 5/2013 | Kanalakis, Jr. et al. |
| D682,847 S | 5/2013 | Gardner et al. |
| D682,866 S | 5/2013 | Peters et al. |
| D687,063 S | 7/2013 | Myung et al. |
| D688,692 S | 8/2013 | Tanghe et al. |
| D691,160 S | 10/2013 | Schupp et al. |
| D694,257 S | 11/2013 | McKinley et al. |
| D698,816 S | 2/2014 | Phelan et al. |
| D699,746 S | 2/2014 | Pearson et al. |
| D700,208 S | 2/2014 | Phelan et al. |
| D704,207 S | 5/2014 | Lee et al. |
| D704,733 S | 5/2014 | Jewitt |
| D706,828 S | 6/2014 | Hollobaugh |
| D709,077 S | 7/2014 | Jonsson et al. |
| 8,788,068 B2 | 7/2014 | Kocis et al. |
| D710,892 S | 8/2014 | Hollobaugh et al. |
| D722,075 S | 2/2015 | Zhang et al. |
| D726,214 S | 4/2015 | Wantland et al. |
| D729,836 S | 5/2015 | Lee |
| D730,388 S | 5/2015 | Rehberg et al. |
| D730,394 S | 5/2015 | Bray |
| D730,397 S | 5/2015 | Oh et al. |
| D730,932 S | 6/2015 | Kim et al. |
| D730,952 S | 6/2015 | Siboni et al. |
| D731,521 S | 6/2015 | Heo et al. |
| D731,525 S | 6/2015 | Myers |
| 9,046,881 B2 * | 6/2015 | Blevins .................. G05B 17/02 |
| D737,299 S | 8/2015 | Hisada et al. |
| D737,321 S | 8/2015 | Lee |
| D750,123 S | 2/2016 | Subramanian et al. |
| 9,354,776 B1 | 5/2016 | Subramanian et al. |
| 2010/0088654 A1 | 4/2010 | Henhoeffer |
| 2010/0332273 A1 | 12/2010 | Balasubramanian et al. |
| 2012/0029661 A1 | 2/2012 | Jones et al. |
| 2013/0339100 A1 | 12/2013 | Warrick et al. |
| 2014/0267425 A1 | 9/2014 | Moll et al. |
| 2014/0330783 A1 | 11/2014 | Provencher et al. |
| 2014/0379112 A1 | 12/2014 | Kocis et al. |
| 2015/0244884 A1 | 8/2015 | Sensu et al. |

OTHER PUBLICATIONS

Pillai, Bindu, Vishal Mehta, and Nilam Patel. "Development of Supervisory Control and Data Acquisition system for Laboratory Based Mini Thermal Power Plant using LabVIEW." International Journal of Emerging Technology and Advanced Engineering.(ISSN 2250-2459, vol. 2, Issue 5, May 2012).*

"AspenTech Brings Search and High Performance Trending to Manufacturing Execution Systems with New Release of Aspen InfoPlus.21® Software", Mar. 6, 2012, PDF downloaded from http://www.aspentech.com/_ThreeColumnLayout. aspx?pageid=2147485680&id=15032385728, (2 pages) on Apr. 29, 2013.

"New Release of Aspen Plus® Software Delivers an Innovative New Interface and Opens Process Simulation to a Wider Range of New Users", Mar. 6, 2012, PDF downloaded from http://www.aspentech.com/_ThreeColumnLayout.aspx?pageid=2147485680&id=15032385734, (3 pages) on Apr. 29, 2013.

"New Release of Aspen PIMS™ and Aspen Petroleum Scheduler™ Software Improves Collaboration Between Refining Planners and Schedulers", Mar. 6, 2012, PDF downloaded from http://www.aspentech.com/_ThreeColumnLayout.aspx?pageid=2147485680&id=15032385732, (2 pages) on Apr. 29, 2013.

"New Release of aspenONE® Software Enables Process Engineers to Display Real-Time Data on Simulation Flowsheets for the First Time", May 14, 2012, Pdf downloaded from http://www.aspentech.com/_ThreeColumnLayout.aspx?pageid=2147485680&id=15032386067, (2 pages) on Apr. 29, 2013.

"AspenTech Announces Availability of aspenOne® V8 Process Optimization Software", Dec. 10, 2012, PDF downloaded from http://www.aspentech.com/_ThreeColumnLayout. aspx?pageid=2147485680&id=15032387367, (3 pages) on Mar. 11, 2014.

"Version 8.4 of aspenONE® Software Expands Activation Capability to Optimize Energy, Economics, and Heat Exchanger Designs", Nov. 25, 2013, PDF downloaded from http://www.aspentech.com/_ThreeColumnLayout.aspx?pageid=2147485680&id=15032390879, (3 pages) on Mar. 11, 2014.

U.S. Appl. No. 14/186,796, filed Feb. 21, 2014, "Applied Client-Side Service Integrations in Distributed Web Systems".

U.S. Appl. No. 14/101,216, filed Dec. 9, 2013, "Activated Workflow".

"New Assay Management Functionality in Aspen Pimstm Software Optimizes Crude Purchasing Decisions and Increases Profitability," Aug. 27, 2012, PDF downloaded from http://www.aspentech.com/_ThreeColumnLayout.aspx?pageid=2147485680&id=15032386682, (2 pages) on Mar. 11, 2014.

U.S. Appl. No. 14/187,958, filed Feb. 24, 2014, "Achieving Stateful Application Software Service Behavior in Distributed Stateless Systems,".

U.S. Appl. No. 29/550,221, filed Dec. 31, 2015, "Display Screen With Graphical User Interface,".

* cited by examiner

METHOD AND SYSTEM TO UNIFY AND DISPLAY SIMULATION AND REAL-TIME PLANT DATA FOR PROBLEM-SOLVING

BACKGROUND OF THE INVENTION

The process industry goes through rigorous planning, designing, construction, and operating procedures. Plant conditions fluctuate all the time, but the plant also has multiple modes of operation, e.g. summer mode, winter mode; normal throughput, reduced or increased throughput; also different grades of product or a different feedstock require the plant to operate in a different mode.

The existing method of comparing a model to plant data is time consuming. Process engineers typically do not have direct access to tools to access live plant data, requiring collaboration with operations personnel. Large volumes of plant data are exported to spreadsheets and events are analyzed using spreadsheet plotting tools. Having identified an event, values are copied from the spreadsheet to modeling tools. Some existing techniques for plant data measurements also include manual plant measurements from data historians, which do not provide real-time data. Some existing techniques for simulation include batch simulations, which are computationally intensive, and therefore do not complete quickly enough to be presented in a real-time manner. All of these existing methods may be time consuming.

SUMMARY OF THE INVENTION

There is a need in the process industry for an invention that overcomes these disadvantages. In this process engineering realm, there needs to be a way to correlate design specification with current status of plant operation. It is essential to determine whether the plant is operating as designed. To make sure that the plant is operating properly, there needs to be a software-based mechanism that may compare and contrast a planned design specification with actual data from a plant in a correlated real-time manner.

A solution is needed to bring together data from two different business domains: the process engineers who use models to design and optimize process equipment and the plant operations engineers who use data historians to monitor the plant and troubleshoot quality and operability issues. A solution is needed to bring together these two business domains to enable plant data from historians to be used to synchronize a model to the current plant operation, and use of the model to analyze and troubleshoot the plant. Such a solution is needed to provide direct access to the plant data from within the model so that model variables may be mapped to a continuous stream of plant data. Such a solution is needed to facilitate a sophisticated trouble shooting experience where decisions are made with facts and figures with context sensitive data and not with the blind assumptions and approximate fudge factors of the current systems.

Additionally, it is not intuitive for existing systems to come up with such a solution because many challenges are faced by all web applications, such as latent communication, a weak presentation layer, devices, and a lack of standards.

Professionals from process and plant business domains need a platform that combines (and correlates) plant and process data, and a platform where they may socialize, search and share context sensitive data in order to frame a plant or process problem. There is a need for a system that allows professionals to easily map design specifications of unit operations with real time information produced by plant equipment.

The process design office and the real-time plant may operate differently. They may be different business units situated in different geographical locations. In the present invention, sensors implemented at the plant provide real-time data which is integrated with the software system installed at the process design office. The present invention forms a system and enables data integration between the design office and the plant. In such a scenario, the present invention helps by bringing simulation and real-time plant data together in a single unified, time synchronized, collated graphical view facilitating very efficient and effective maintenance of the plant. The present invention not only helps the user with maintaining and monitoring normal operation, but the present invention also helps with trouble shooting and problem solving of simulation and plant operational issues.

The present invention includes a system that provides a way for process or plant engineers to view model results side-by-side (effectively time synchronized) with plant data. This system immensely helps by providing sophisticated graphical user interface techniques with a collaborative trouble shooting workflow. The workflow involves searching, sharing, integration with external data, mapping, analyses, troubleshooting, monitoring, maintaining, and problem solving of plant operation. In turn, the system improves the end user experience, facilitates data and information monetization, and helps to integrate products. The system of the present invention is also flexible and easily includes other search, share, mapping, and troubleshooting workflows between one or more heterogeneous systems.

An advantage of the present invention is that it provides a highly intuitive and effective system that brings disparate systems together. The present invention brings together, in a collated manner, real-time plant data with process simulation data which is a preferred way to compare planned and actual estimates for the plant data. In one embodiment of the present invention, the present invention uses aspenONE (Trademark of Assignee) and Aspen Search (Trademark of Assignee) which bring together real-time data and simulation data together in Aspen PLUS (Trademark of Assignee), Aspen HYSYS (Trademark of Assignee), and Aspen Simulation Workbook (ASW) (Trademark of Assignee). However, the present invention may include other such simulation tools.

A further advantage of the present invention is that the system includes an enhanced workflow to help remove uncertainty and ambiguity because the workflow presents facts by interacting with data sources directly. One advantage of the present invention is that it includes a "Progressive Visual Collaboration" (PVC) technique that enables a dynamic media where engineers from respective domains are enabled to socialize and troubleshoot a problem by sourcing critical, context-relevant information. PVC removes ambiguity and uncertainty by considering factual data, and provides progressive workflow to enable problem-solving.

The present invention includes a computer-implemented method of managing data for at least one user comprising: sensing actual real-time processing plant operation status data for at least one asset from a set of assets of a processing plant through at least one sensor; recording, to a computer server, the actual real-time processing plant operation status data sensed from the at least one sensor; performing a simulation, through at least one simulation model from a set of simulation models of a planned process design specification, through a computer-implemented simulation engine; recording process design specification data from the simulation, through the computer-implemented simulation engine; correlating the actual real-time processing plant operation status data and the process design specification data through a computer-implemented correlation engine, into a set of correlated data; displaying the set of correlated data, to the at least one user through a computer display, such that the actual real-time processing plant operation status data and the process design specification data are streaming, and visually presented, concurrently, to the at least one user at the same time; and displaying at least one set of further details of the set of correlated data, based upon interaction from the at least one user through a user interface.

The present invention further includes a method wherein the actual real-time processing plant operation status data is used as feedback and provided to the at least one simulation model, thereby improving accuracy of the at least one simulation model. The present invention further includes a method wherein a plurality of scenarios may be simulated by adjusting model parameters of the at least one simulation model and further performing the simulation. The present invention includes a further step of: applying a scenario, from a plurality of scenarios, to the set of assets, to resolve an issue. The present invention includes the further steps of: locating at least one plant identifier, within the actual real-time processing plant operation status data, when presented with a search command by the at least one user; associating the at least one plant identifier to at least one simulation model variable of the at least one simulation model; displaying the at least one plant identifier together with the at least one simulation model variable and together with the at least one set of further details of the set of correlated data that include one of, based on user selection, and over a user-specified time range, at least one of the following: live data, real-time data, time-averaged data, historical averaged data, trend data, or historical performance trend data.

The present invention further includes a method wherein the at least one set of further details of correlated data includes, based on user selection, and over a user-specified time range, at least one of the following: a graph, a pictograph, a bar graph, a scatter plot, a pie graph, a histogram, a bar chart, a pie chart, a Gantt chart, a line cart, a candlestick chart, or a table. The present invention further includes a method wherein the actual real-time processing plant operation status data and the process design specification data are displayed together in a manner in which they share the same timeline, the same time scale, the same current time, and the same previous start time, and are displayed within a user-specified time range.

The present invention further includes a method wherein the at least one set of further details of the correlated data include one of, based on user selection, live data, real-time data, time-averaged data, historical averaged data, trend data, or historical performance trend data. The present invention further includes a method wherein the set of correlated data forms a plurality of sets of correlated data which are displayed concurrently with each other. The present invention further includes a method wherein the computer-implemented simulation engine and the at least one sensor are at different geographic locations, and the actual real-time processing plant operation status data and the process design specification data are linked through a computer network.

The present invention further includes a method wherein planned estimates for the actual real-time processing plant operation status data are compared against actual results for the actual real-time processing plant operation status data. The present invention further includes a method wherein the computer display is implemented using a computer monitor, personal computer, laptop, desktop, phone, smart phone, mobile phone, projection device or other computer (digital processing) device.

The present invention further includes a method wherein the at least one simulation model includes multiple versions, and multiple users may perform modifications to the at least one simulation model, where the modifications may be performed in either a shared or private manner, where the multiple users need not be in the same geographic location, and where the multiple versions may be saved and restored. The present invention includes the further steps of: storing content in content storage, the content including user profile information, authentication information, and membership; and allowing the at least one user to search the content storage, through a search service, for actual real-time processing plant operation status data and process design specification data.

The present invention includes a computer system for use in managing data for at least one user, comprising the following computer-implemented elements: at least one sensor that senses actual real-time processing plant operation status data for at least one asset from a set of assets of a processing plant; a computer server that records the actual real-time processing plant operation status data sensed from the at least one sensor; a computer-implemented simulation engine that performs a simulation, through at least one simulation model from a set of simulation models of a planned process design specification, and records process design specification data from the simulation; a computer-implemented correlation engine that correlates the actual real-time processing plant operation status data and the process design specification data, into a set of correlated data; a computer display that displays the set of correlated data, to the at least one user, such that the actual real-time processing plant operation status data and the process design specification data are streaming, and visually presented, concurrently, to the at least one user at the same time; and a user interface that the user interacts with, to display, through the computer display, at least one set of further details of the set of correlated data.

The present invention further includes a computer system wherein the actual real-time processing plant operation status data is used as feedback and provided to the at least one simulation model, thereby improving accuracy of the at least one simulation model.

The present invention further includes a computer system wherein the computer-implemented simulation engine simulates by adjusting model parameters of the at least one simulation model and further performing the simulation. The computer-implemented simulation engine in one embodiment applies a scenario, from a plurality of scenarios, to the set of assets, to resolve an issue.

Embodiments of the present invention system (for example, the computer-implemented correlation engine) locate at least one plant identifier, within the actual real-time processing plant operation status data, when presented with a search command by the at least one user; associate the at least one plant identifier to at least one simulation model variable of the at least one simulation model; display the at least one plant identifier together with the at least one simulation model variable and together with the at least one set of further details of the set of correlated data that includes, based on user selection, and over a user-specified time range, at least one of the following: live data, real-time data, time-averaged data, historical averaged data, trend data, or historical performance trend data.

The present invention further includes a computer system wherein the at least one set of further details of the set of correlated data includes, based on user selection, and over a user-specified time range, at least one of the following: a graph, a pictograph, a bar graph, a scatter plot, a pie graph, a histogram, a bar chart, a pie chart, a Gantt chart, a line cart, a candlestick chart, or a table. The present invention further includes a computer system wherein the actual real-time processing plant operation status data and the process design specification data are displayed together in a manner in which they share the same timeline, the same time scale, the same current time, and the same previous start time, and are displayed within a user-specified time range. The present invention further includes a computer system wherein the at least one set of further details of the correlated data include one of, based on user selection, live data, real-time data, time-averaged data, historical averaged data, trend data, or historical performance trend data. The present invention further includes a computer system wherein the set of correlated data forms a plurality of sets of correlated data which are displayed concurrently with each other. The present invention further includes a computer system wherein the computer-implemented simulation engine and the at least one sensor are at different geographic locations, and the actual real-time processing plant operation status data and the process design specification data are linked through a computer network.

The present invention further includes a computer system wherein planned estimates for the actual real-time processing plant operation status data are compared against actual results for the actual real-time processing plant operation status data. The present invention further includes a computer system wherein the computer display is implemented using a computer monitor, personal computer, laptop, desktop, phone, smart phone, mobile phone, or other computer (digital processing) device. The present invention further includes a computer system wherein the at least one simulation model includes multiple versions, and multiple users may perform modifications to the at least one simulation model, where the modifications may be performed in either a shared or private manner, where the multiple users need not be in the same geographic location, and where the multiple versions may be saved and restored. The present invention further includes content storage storing content. The content includes user profile information, authentication information, and membership data. The system in one embodiment allows the at least one user to search the content storage, through a search service, for actual real-time processing plant operation status data and process design specification data.

The present invention includes a computer program product comprising: one or more non-transitory computer-readable storage media having computer-executable components for use in managing information for a user, said components comprising: at least one sensor element (sensor) that senses actual real-time processing plant operation status data for at least one asset from a set of assets of a processing plant; a computer server that records the actual real-time processing plant operation status data sensed from the at least one sensor; a computer-implemented simulation engine that performs a simulation, through at least one simulation model from a set of simulation models of a planned process design specification, and records process design specification data from the simulation; a computer-implemented correlation engine that correlates the real-time processing plant operation status data and the process design specification data, into a set of correlated data; a display driver that displays the set of correlated data, to the at least one user, such that the actual real-time processing plant operation status data and the process design specification data are streaming, and visually presented, concurrently, to the at least one user at the same time; and a user interface that the user interacts with, to display, through the computer display, at least one set of further details of the correlated data.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 3A illustrates process steps of an example workflow.

FIG. 3B illustrates selecting data and generating an associated data chart in the present invention.

FIG. 3C depicts a scenario where the process engineer may view the simulation result and real-time plant data side-by-side.

FIG. 3D illustrates that while viewing the simulation results the user may view a historic performance trend of the plant data and simulated data.

FIG. 3E illustrates a high performance trend (HPT) view of the plant data and simulated data.

FIG. 3F illustrates a view of a Workspace User Interface.

DETAILED DESCRIPTION OF THE INVENTION

A description of example embodiments of the invention follows.

Figure 1:
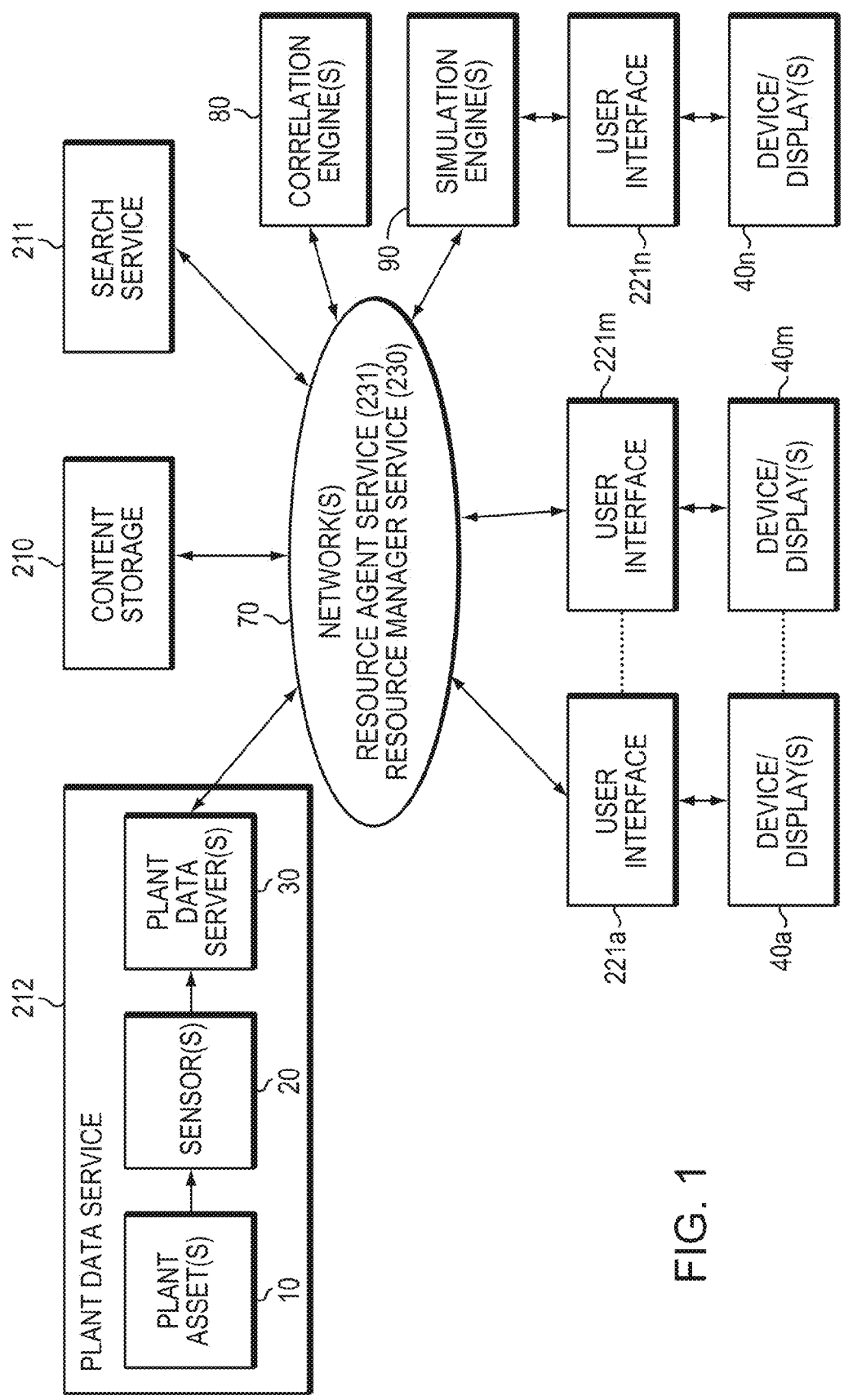
FIG. 1 is a schematic view of the computer processing system embodying the present invention.

FIG. 1 is a schematic view of the computer processing system embodying the present invention. In a preferred embodiment, each element in FIG. 1 may be implemented in software, hardware, or both, where each element is executed through a computer processing means. Each FIG. 1 element may either be in the same geographic location, or in a different geographic location, compared with other elements. In FIG. 1, each element may be either plural or singular.

FIG. 1 illustrates a plant data service 212 that includes a plant asset 10 being monitored by a sensor 20, and a sensor recording a plant measurement of plant data to a plant data server 30. For example, the assets 10 of a processing plant may include, but are not limited to, distillation columns, pumps, valves, heat exchangers, evaporators, boilers, and other assets.

A simulation engine 90 performs a simulation on a simulation model from a set of simulation models of a planned design specification. The simulation engine 90 produces simulation data. The simulation data (from 90) and plant data (from 212) is received through the network 70 and passed to a correlation engine 80. The correlation engine 80 correlates the simulation data and plant data and outputs the correlated data through one more user interfaces 221 (where 221 includes at least 221a, 221m, 221n) to one more displays 40 (where 40 includes at least 40a, 40m, 40n), as show in FIG. 1. Note that the display 40 is accessible over the network 70 (this is known as "Progressive Visual Collaboration" provided by aspenONE of Assignee) and the display is accessible locally by the simulation engine 90 (as in Aspen Search by Assignee). Through the network 70, which also may function as a system controller, the system preferably includes Content Storage 210, a Search Service 211, a Resource Manager Service 230, and a Resource Agent Service 231. Multiple users all have access to provide input, across different geographic locations through the network 70.

Figure 2A:
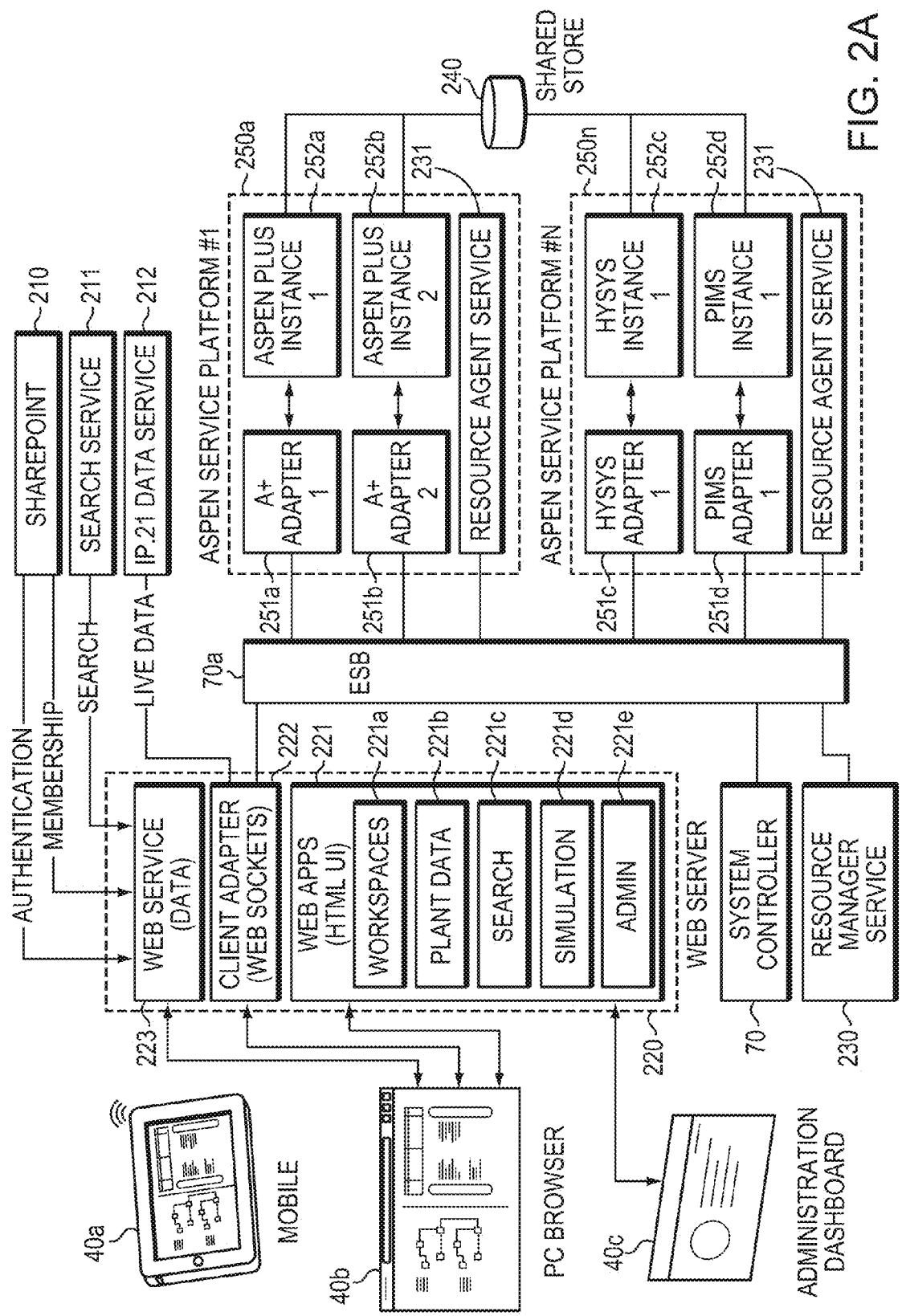
FIG. 2A is a preferred detailed architectural implementation diagram of the present invention from FIG. 1.

FIG. 2A is a preferred detailed architectural implementation diagram of the present invention from FIG. 1. In a preferred embodiment, each element in FIG. 2A may be implemented in software, hardware, or both, where each element is executed through computer processing means. Each element may either be in the same geographic location, or in a different geographic location compared with other elements. In FIG. 2A, each element may be either plural or singular.

Figure 3A:
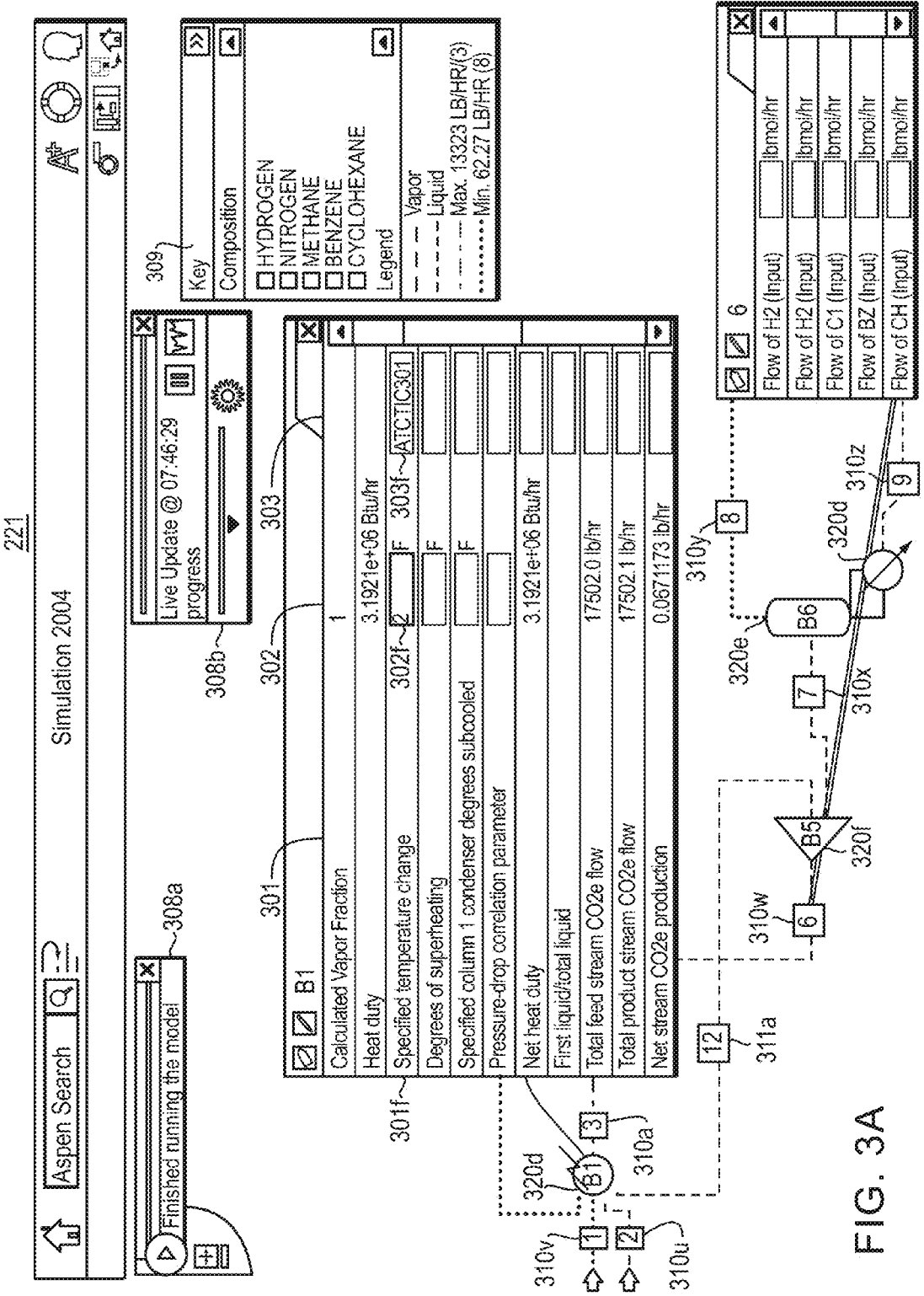
FIGS. 3A, 3B, 3C, 3D, 3E, and 3F illustrate user interfaces of the present invention.

The preferred Content Storage 210 implementation is Microsoft Sharepoint, however, embodiments of the present invention may also use other content storage implementations in place of Microsoft Sharepoint. The Content Storage 210 is used to store user profile information, authentication information, and membership information, that is communicated to the user through a Web Service (Data) 223 to a computer display 40 for the user, where the Web Service may optionally be included in a Web Server 220. The computer displays 40 (where 40 at least also includes 40a, 40b, 40c, 40m, and 40n), shown in FIG. 1 and FIG. 2A, include but are not limited to a computer monitor, personal computer, laptop, desktop, phone, smart phone, mobile phone, projection device, or other computer (digital processing or computing) device. The user is provided with Web Applications that include User Interfaces (UI) 221 that at least include Workspaces 221a, Plant Data 221b, Search 221c, Simulation 221d, and Administration 221e, where the UIs may optionally be included in a Web Server 220. The UI is implemented in Hypertext Markup Language (HTML) but alternative implementations may be used. Workspaces 221a have a unified user interface that allows the user to store the search result, store modification changes, store snapshots of plant data, and store merged views of plant data. FIG. 3F illustrates a view of a Workspace UI 221a. In addition, the present invention includes an aspenONE (Trademark of Assignee) infrastructure that provides capabilities for simulation, search, workspaces, and other UIs into a single content area 2001, as shown in FIG. 3G.

A Search UI 221c allows the user to search, through a Search Service 211, for both actual real-time processing plant operation status data and process design specification data. The Search Service 211 software extracts metadata from the simulation model files, and plant data, and indexes that data into the search.

Sensors 20 perform plant data measurements from plant assets 10 and report the plant data measurements through plant data servers 30 through an Aspen InfoPlus.21 (IP.21 of Assignee) data service 212. The plant data, indicated as "Live Data" in FIG. 2A, includes live data, historical data, and other types of plant data. This plant data is provided to the Client Adapter (Web Sockets) 222, where the Client Adapter may optionally be included in a Web Server 220. As illustrated in FIG. 2A, plant data from the IP.21 Data Service 212 and simulation data from the Enterprise Service Bus (ESB) 70a are simultaneously input to the Client Adapter 222. A Correlation Engine 80 correlates the simulation data and plant data into a set of correlated data. In a preferred embodiment, the Correlation Engine 80 utilizes the Web Service 223, the Client Adapter 222, and the Workspaces Web Application 221a, in order to correlate the data. However, in alternative embodiments, the Correlation Engine 80 does not require all three elements and may include other elements. For example, Correlation Engine 80 applies techniques that adjust time scale of the simulation data and/or the plant data (or otherwise time synchronizes the data) to form correlated data. The plant data and simulation data together form the correlated data which is visually presented to the user through a computer display 40 in a "side-by-side" manner, which means that the plant data and the simulation data may be together, concurrent, time synchronized, streaming, visually corresponding, correlated, overlaid, contiguous, side-by-side, neighboring, adjoining, adjacent, juxtaposed, or associated in nature, or form a nexus.

The simulation data is received by the Client Adapter 222 as follows. The Client Adapter 222, on behalf of the user, requests an available simulation resource from the Resource Manager 230. This request is the result of applying a Simulation Service 250 to a model that the user is viewing in the aspenONE (by Assignee) Simulation Application 221d. If the Resource Manager 230 grants/accepts the request, based upon compatibility and availability, then access to a simulation resource in Aspen Services 250 is provided, and a request is performed through the Enterprise Service Bus (ESB) Network Element 70a which forwards to the Aspen Application Services 250a . . . 250n (generally 250) to obtain a simulation resource. Within one or more instances of Aspen Services 250, the simulation resource may include one or more instances of Aspen Plus 252a, 252b, Aspen HYSYS (Hydro Carbon Simulation System) 252c, Process Information Management System (PIMS) 252d, or other types of simulators. Multiple simulation resources 252 may have the same UI or separate UIs. In addition, a Resource Agent Service 231 starts and stops Adapters 251 (where 251 at least includes 251a, 251b, 251c, and 251d). The adapters 251 adapt application-specific settings and instructions between software languages. The adapters 251 are also used to provide a connectivity mechanism to the ESB 70a for a given instance of a simulator 252. When the simulation instance 252 and the corresponding adapter 251 are activated, then simulation data from the shared store 240 may be transferred through the ESB 70a to the Client Adapter 222. Once a simulation resource is established, the Client Adapter 222 has exclusive access to the simulator. Note, multiple simulators may be used, such as HYSYS (Trademark by Assignee) and Aspen Plus (Trademark by Assignee) simulators, but this fact is transparent to the user. Based on request parameters and/or other input from Resource Manager 230 and Client Adapter 222, the system knows which type of simulator is required and automatically interacts with the correct one. Note, if a deployment does not have any HYSYS simulators installed, the simulation service is preferably not seen in the dynamic service bar. The Aspen Service 250 sends replies and other messages to the Client Adapter 222 that the application 252 publishes for the client to read.

Note that data from the shared store 240 may include any user-driven data meant for sharing. Note that both the Aspen Services 250 and the data from the shared store 240 are not limited to simulation, and other types of applications 252 using other types of Aspen Services data from the shared store 240 may be used, such as, but not limited to, process control, planning, scheduling, manufacturing, accounting, manufacturing supply chain (MSC) products, supply chain logistics, anything that requires automation in a plant or process, anything that performs processing of crude oil, or other types. In addition, as shown in FIG. 2A, multiple platform instances 250 may be used and multiple application instances 252 may be used. Aspen Plus 252a, 252b, and Aspen HYSYS 252c each provide a comprehensive process modeling system, and PIMS 252d provides a planning and optimization solution. Note also that the simulation resource may also include both the Adapter 1 251a and the corresponding Aspen Plus Instance 252a and may optionally include a Monitor. The simulation resource has access to the Shared Store of simulation model information 240, so the Client Adapter 222 may retrieve simulation data.

The Resource Agent 231 runs locally on a simulation service server (supports 250). The Resource Agent 231 starts and stops Adapters 251 (where 251 at least includes 251a, 251b, 251c, and 251d) based on configurations and commands, which may be changed at runtime. At startup, the Resource Agent 231 reads its configuration and starts the appropriate number of Adapters 251 which may be implemented as HYSYS Adapters, PIMS Adapters, Aspen Plus Adapters, and/or other types of Adapters. The Adapters 251 initialize and register with the Resource Manager 230. The Resource Agent 231 has a license to kill (stop) any service process (if tasked by the administrator) to keep the machine clear of hanging, slow, or otherwise misbehaving service threads. In one embodiment, the "Application" Service Lifecycle is designed to mimic the Desktop Lifecycle, although one skilled in the art may realize that other computer lifecycles may be used. As such, the Resource Adapter 251 is a proxy for the desktop user and starts and stops the application 252 to help ensure stability and to guard against side-effects.

The following is a further explanation of Resource Management from the Client View (at 40, 221). To a system client, there is a mechanism for sharing a limited set of resources across a group of people where access is exclusive for the period of time that it is in use. This process works a lot like bowling. In order to bowl, a user needs shoes. Shoes are limited resources that require exclusive access; while the user is playing, no one else may use them. A representative assigns a pair of shoes in exchange for something a user wants back, like a driver's license (or tokens). When the user finishes, the user returns the shoes to a trusted third party, and after some housekeeping, the shoes become available again and someone else may check them out. In aspenONE (Web Application 221), the trusted third party is the Resource Manager 230 and it oversees a system that is a bit more complex. Like a taxi cab dispatcher, the Resource Manager 230 knows how many cabs are available, how many have riders and how many are "out of service." Such systems are dynamic and may easily adjust if there are problems. The Resource Adapter 251 is a smart proxy and handles all system interaction on behalf of the Application Instance 252 on initialization, it registers the Service with the Resource Manager 230. The Resource Manager 230 preferably does not require apriori knowledge of the Adapter 251. This high level of decoupling makes a system very dynamic and scalable.

The Resource Adapter 251 preferably services user requests after it has been assigned to a specific client; the assignment process is called "binding" and includes a binding ID that drives dynamic routing. The binding ID is held by both the client and the Adapter 251. A bound Resource Adapter 251 begins to receive user requests for processing and spins up an instance of the application 252, which checks out tokens. As with any other System Service 250, the Adapter 251 publishes responses, System Events and Notifications via messaging.

The Resource Adapter 251 functions as a proxy for the Service 250 and when not actively servicing requests, the Service instance preferably does not exist. When the Application Instance 252 is brought into being by Adapter 251, communication occurs via a Case Execution Service (CXS). This pattern allows the Resource Adapter 251 to continue to participate in Automation, System Management and Administrative functions. The Adapter is a stand-alone system component and like all components, preferably providing regular status reports even if there is no application currently running Once connected to the backbone, the Resource Adapter 251 provides Service Access 250 by receiving requests, publishing events, responses and notifications on behalf of itself and the application instance. Adapter(251)/Application(252) communication occurs via CXS.

Figure 2B:
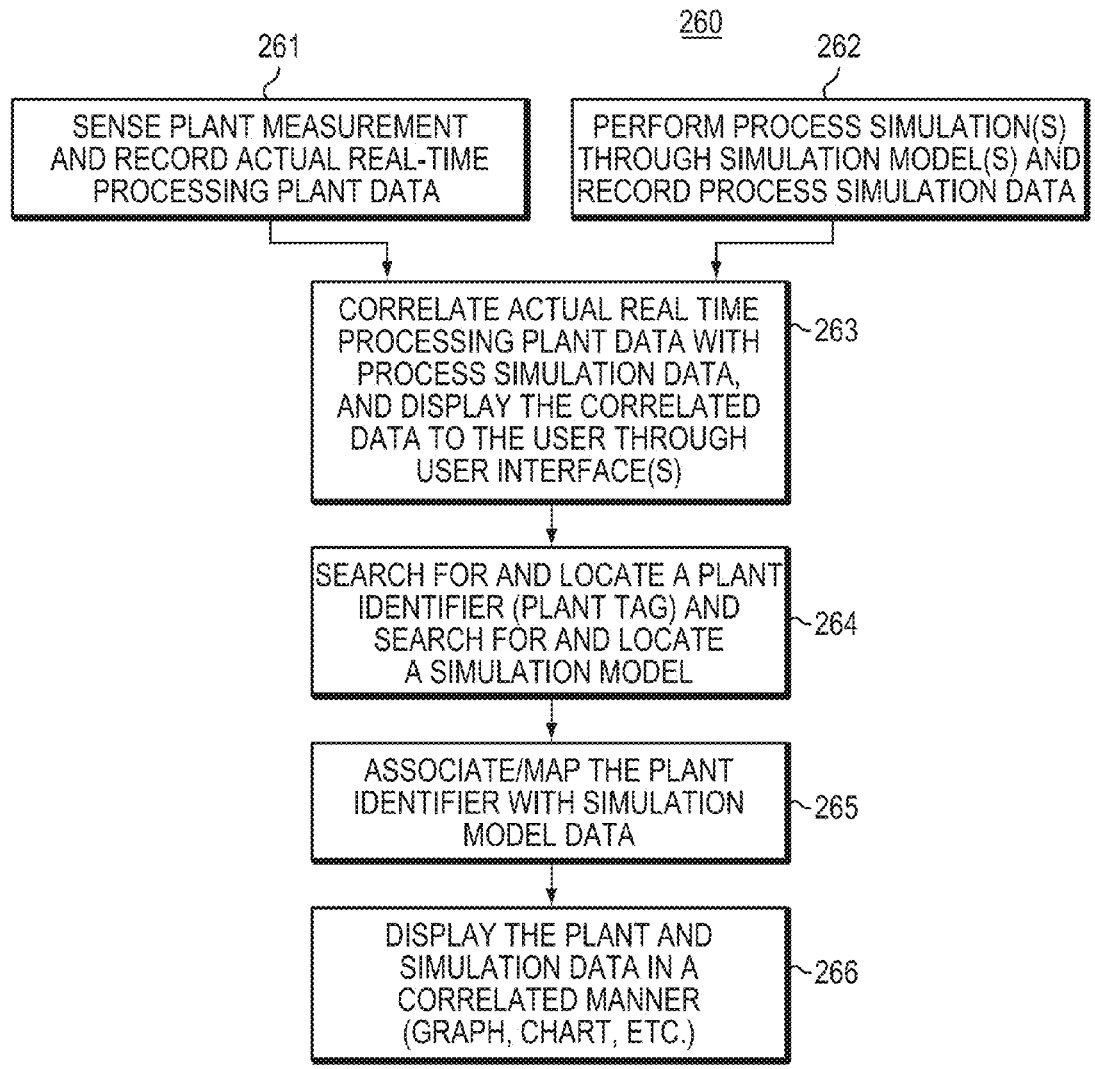
FIG. 2B is a preferred procedural flowchart of the present invention of FIG. 1.

Referring back to FIG. 1, the associated FIG. 2B represents a preferred flowchart 260 of the embodiment of FIG. 1. Plant data is sensed and recorded 261 while simulations are performed that simulate process models and record simulation data 262. In step 263, the actual processing plant data from step 261 is correlated with the simulation process data from step 262, and the result is displayed to the user through a user interface 221. The user may further search for and locate a plant identifier and simulation model in step 264. In step 265, the user may associate/map the plant identifier with the simulation model data. In step 266, the user makes a selection through the user interface that results in a display of the plant and simulation data in a correlated manner such as a graph, chart, a pictograph, a bar graph, a scatter plot, a pie graph, a histogram, a bar chart, a pie chart, a Gantt chart, a line cart, a candlestick chart, a table, or other display types, and the data may be displayed as live data, real-time data, time-averaged data, historical averaged data, trend data, historical performance trend data, or other data types.

As discussed earlier, the present invention enables the process engineer, within the modeling tool, to search for plant data identifiers by name, description and other metadata, and map these identifiers to model variables. The screen shot shown in FIG. 3A presents a user interface 221 that facilitates the process engineer to search for actual plant data tags 303 and associate them with that of unit operations 301, and with the corresponding conceptual process tags 302, of the model being worked on. FIG. 3A illustrates process steps of a workflow, including but not limited to step 1 310v, step 2 310u, step 3 310a, step 6 310w, step 7 310x, step 8 310y, step 9 310z, and step 12 311a. The FIG. 3A workflow assets 320d, 320e, and 320f include, but are not limited to, distillation columns, pumps, valves, heat exchangers, evaporators, boilers, other assets and other process industry workflow elements. In the UI 221, a composition key/legend 309 is shown, as well as icons which provide status of the simulation model 308a, and update progress 308b.

Mapping is performed as follows. Please refer to FIG. 3A. Please refer to column 301 which is located in the stream table named B1 in FIG. 3A. Please refer to element 301*f* that says "Specified Temperature Change" in column 301. On the same row as 301*f*, the user changes the value of the temperature to 2 degrees Fahrenheit (2 F) in element 302*f*. Next, the user maps to a TAG element 303*f* named "ATC-TIC301" on column 303. This tag 303*f* maps to an IP.21 data service 212. After doing the mapping from conceptual data 302 to actual data 303, by selecting conceptual data and actual data respectively, as shown in FIG. 3B, the model user may choose to view live data, time averaged values or average values over a specified time range which are displayed next to the mapped model value, or real-time data, historical averaged data, trend data, historical performance trend data, or other data types.

Figure 3B:
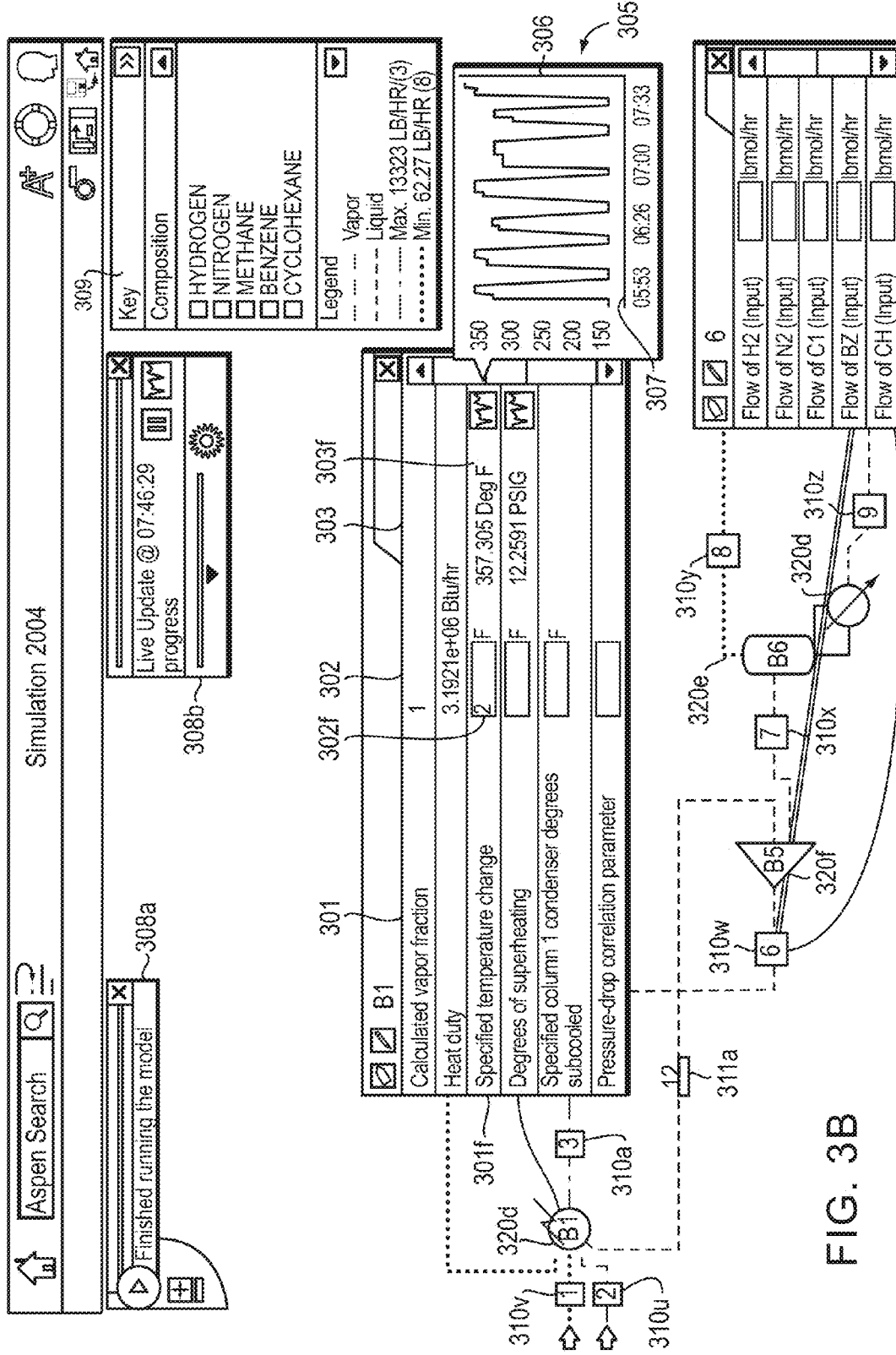

In the FIG. 3B example, a parameter "Specified temperature change" is selected in column 301, and the associated real-time historical plant data 306 is shown in the chart 305 with associated timing 307, corresponding with the current live plant data value in column 303.

Rigorous first principles models are frequently used to troubleshoot or optimize process manufacturing plants. To apply a rigorous first principles model to an asset requires identifying data and collecting measurement values over multiple time periods. Steady states (plant values not changing over time) are required before they may be used in a model. The problem of identifying data, gathering historical trends, identifying steady states and calculating averages over those steady states is extremely time consuming and is attempted by only a few engineers. These plant averages are used to calibrate the model. Once the model has been calibrated, through what if studies it may be used to analyze the cause of the problem and investigate multiple scenarios to resolve the issue.

One aspect of the present invention is provided by an offering from the assignee called Aspen Search. Aspen Search is a major search capability provided for Aspen-Tech's engineering products such as Aspen Plus and Aspen HYSYS. When the user logs on to Aspen Plus or HYSYS, the user has the ability to search for any simulation model. From within the simulation flow sheet, the process engineer may point to a plant data server (running a data historian like IP.21) and map specific plant data tags against selected model stream variables and see how the plant is trending. This allows the end-user to view real-time, time-averaged or historical averaged data as well as data trends which help to facilitate operations support applications. Target customers for this product are those who regularly use models to troubleshoot plant operations.

Figure 3C:
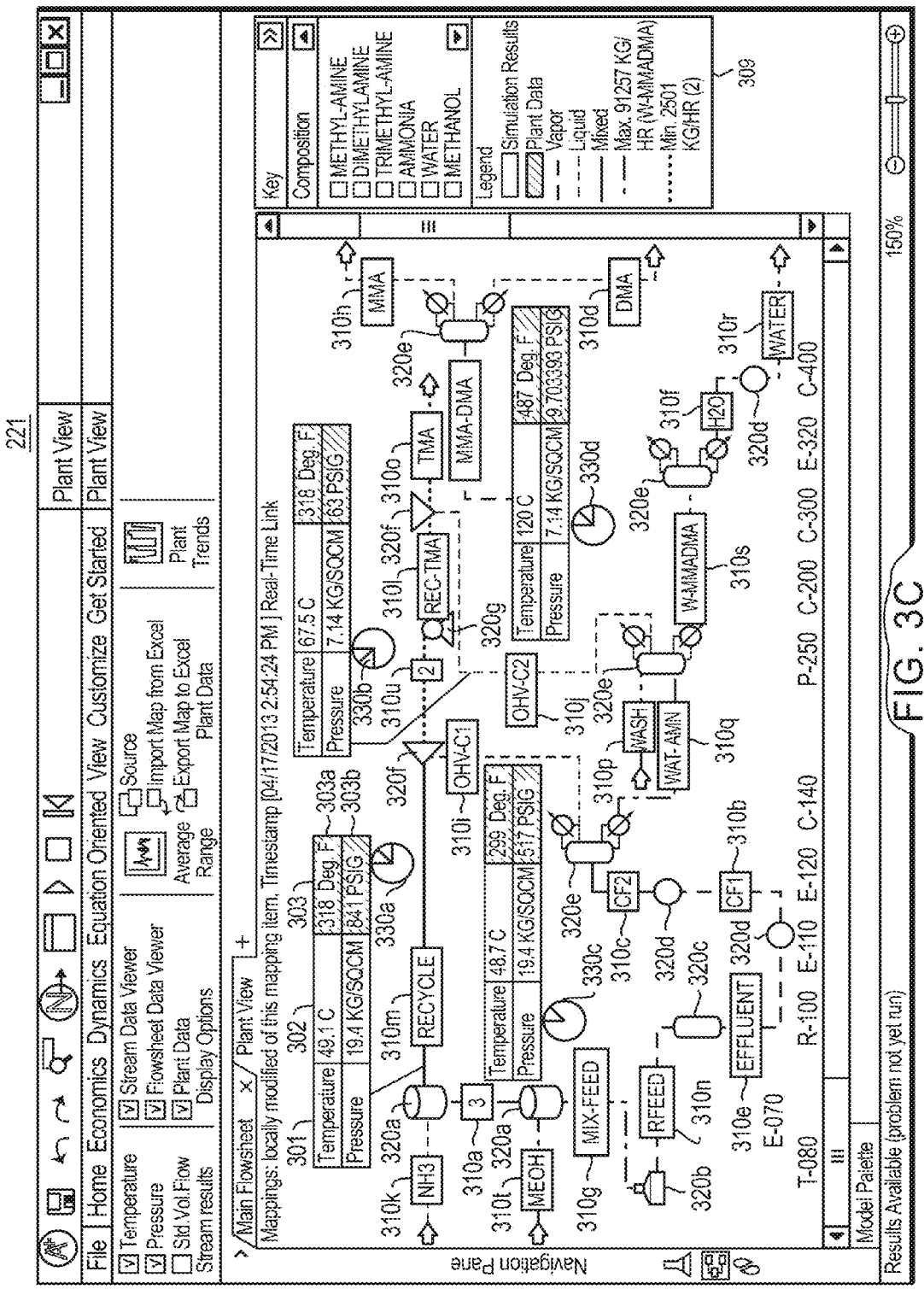

FIG. 3C below depicts the scenario when the process engineer is able to view the simulation result and real-time plant data side-by-side (collated and synchronized). FIG. 3C illustrates a process plant design workflow UI of the present invention. The workflow steps 310-311 include, but are not limited to step 1 310*v*, step 2 310*u*, step 3 310*a*, step 6 310*w*, step 7 310*x*, step 8 310*y*, step 9 310*z*, step 12 311*a*, CF1 310*b*, CF2 310*c*, DMA 310*d*, EFFLUENT 310*e*, H20 310*f*, MIX-FEED 310*g*, MMA 310*h*, MEOH 310*t*, NH3 310*k*, OVH-C1 310*i*, OVH-C2 310*j*, REC-TMA 310*l*, RECYCLE 310*m*, RFEED 310*n*, TMA 310*o*, WASH 310*p*, WAT-AMN 310*q*, WATER 310*r*, and W-MMADMA 310*s*. The workflow assets 320*a*, 320*b*, 320*c*, 320*d*, 320*e*, 320*f*, and 320*g*, include at least distillation columns, pumps, valves, heat exchangers, evaporators, boilers, other assets and other process industry workflow elements. Column 301 represents parameters, such as, but not limited to, temperature and pressure. Column 302 represents the corresponding conceptual process values associated with the column 301 parameters. Column 303 represents the corresponding actual plant values associated with the column 301 parameters. The pie chart 330*a* represents the compositions of chemical substances as they apply to the parameters in 301. Similarly, other pie charts 330*b*, 330*c*, 330*d* are shown, each with their own respective parameters.

Figure 3D:
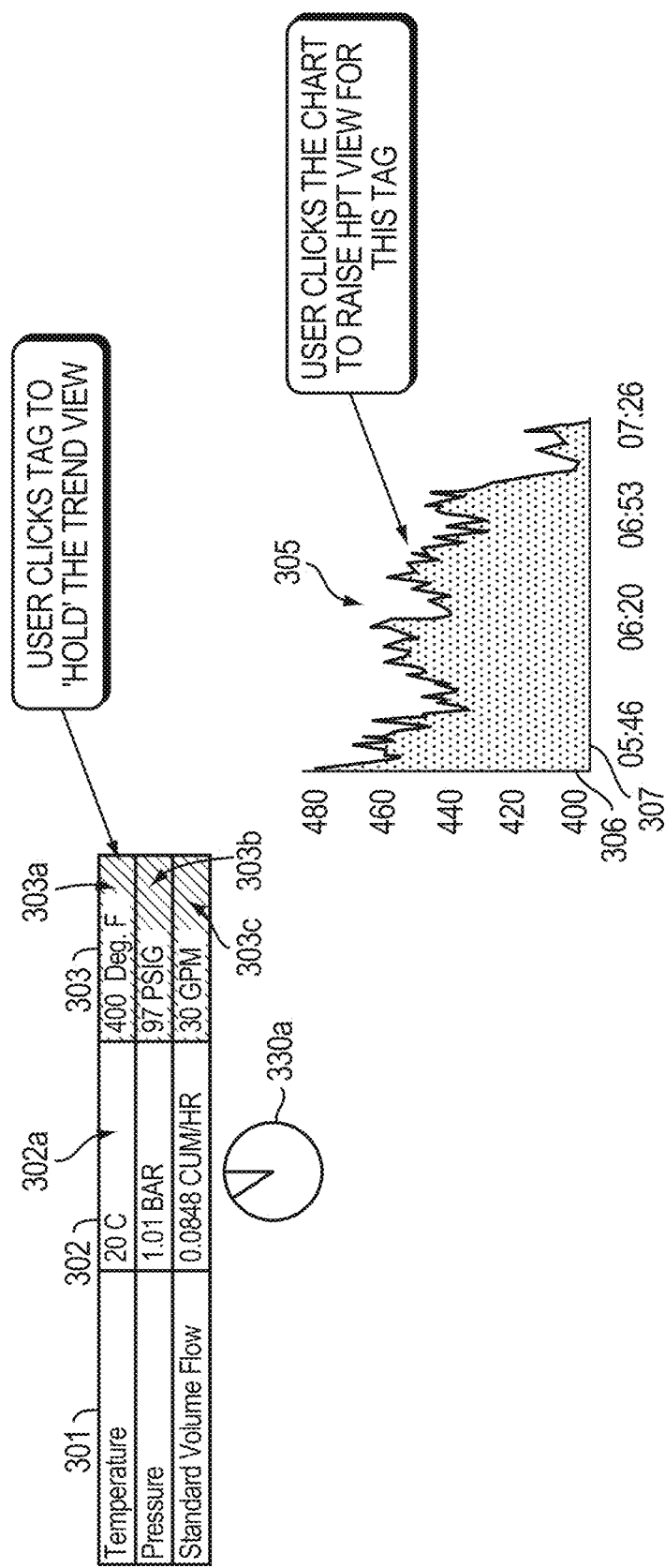

As shown in FIG. 3D, while viewing the simulation results 302 and real-time plant data 303 side-by-side the user may view the historic performance trend 305 of a plant measurement by clicking on an appropriate plant value 303*a*. Plant values for temperature 303*a*, pressure 303*b*, and standard volume flow 303*c* are available, as well as other plant values not shown in the figure. As shown in FIG. 3D, the user may select at least one tag 303*a*, 303*b*, or 303*c* (through a mouse click, or other user interface operation) to hold at least one trend view 305 that may include a horizontal time axis 307 and a vertical value axis 306. In the FIG. 3D example, the historical plant data 303*a* is presented over time 307 in a trend view chart 305, and the associated process simulation data 302*a* is presented as a constant value over time.

Figure 3E:
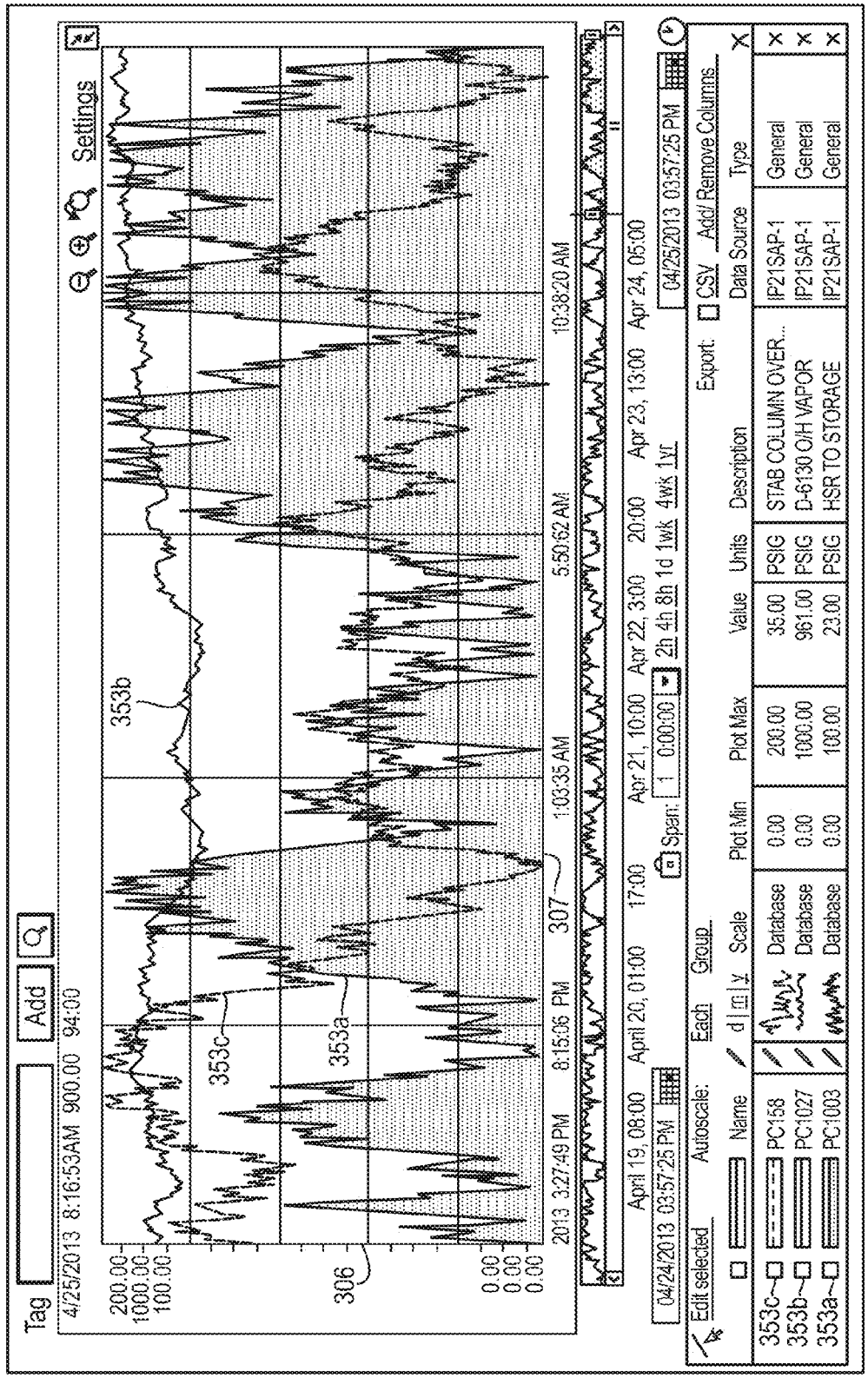
Figure 3F:
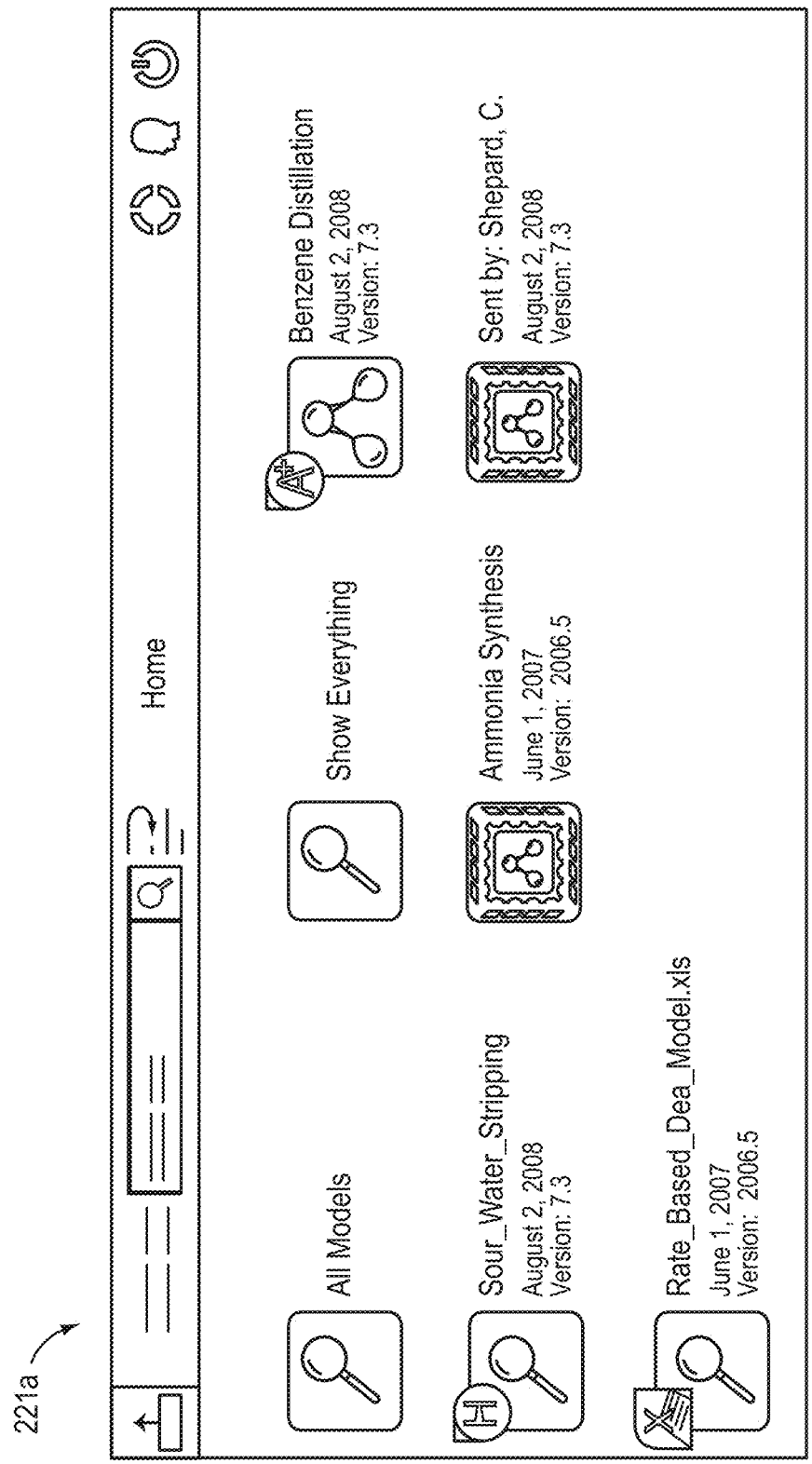
Figure 3G:
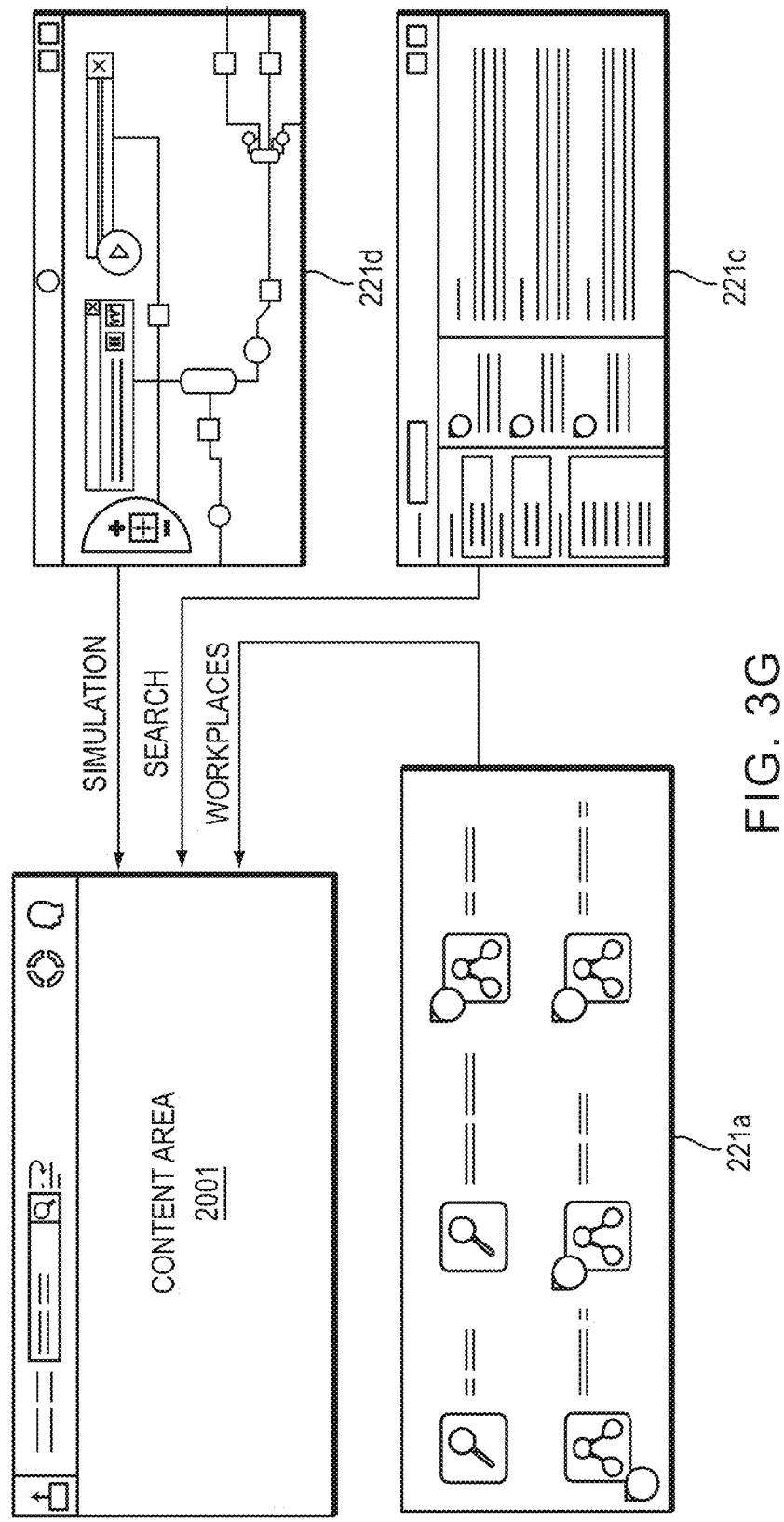
FIG. 3G presents an overview of the infrastructure of the present invention.

As described in FIG. 3D ("User clicks the chart to raise HPT view for this tag"), the user may further select (through a mouse click or other operation) the trend view chart 305. As shown in FIG. 3E, this user selection opens a web browser that displays a High Performance Trend (HPT) view 350 for the selected tag (or tags). High Performance Trends 353 (including but not limited to 353*a*, 353*b*, 353*c*) are associated to tags, which may include but are not limited to IP.21 tags including historic information, as shown in FIG. 3E. Similarly to the trend view 305, the HPT view 350 also includes a horizontal time axis 307 and a vertical value axis 306.

One skilled in the art understands that a corresponding simulation data chart is not always constant or static and there may be two charts presented side-by-side, one for simulation data, and one for plant data, or both charts may be overlaid on top of each other (adjusted to a common time scale). The existing features of High Performance Trends (HPT) from the IP.21 product allow users to view two or more tags concurrently, over a longer time period.

Figure 4:
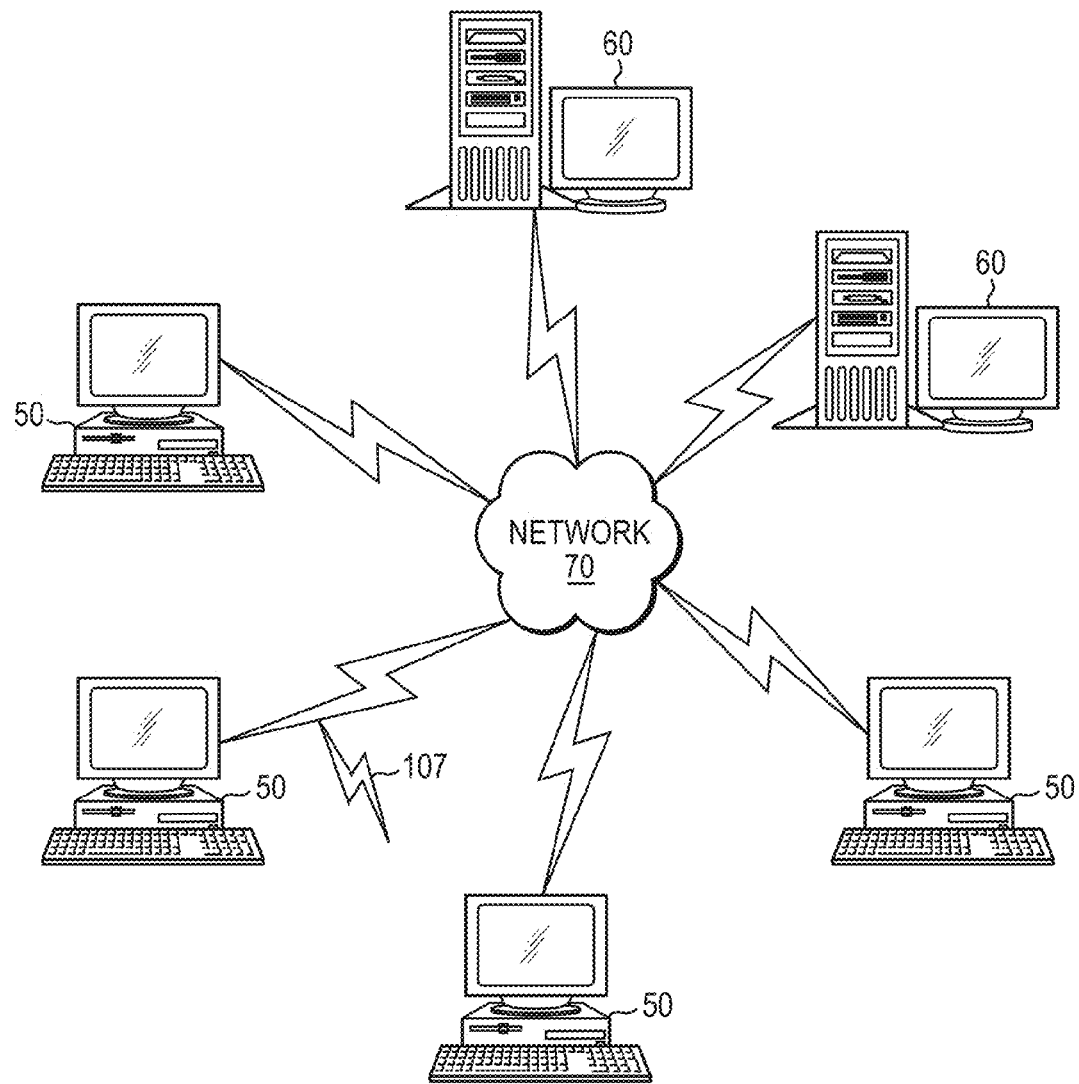
FIG. 4 illustrates a computer network or similar digital processing environment in which the present invention may be implemented.

FIG. 4 illustrates a computer network or similar digital processing environment in which embodiments of the present invention may be implemented.

Client computer(s)/devices 50 and server computer(s) 60 provide processing, storage, and input/output devices executing application programs and the like. Client computer(s)/devices 50 may also be linked through communications network 70 to other computing devices, including other client devices/processes 50 and server computer(s) 60. Communications network 70 may be part of a remote access network, a global network (e.g., the Internet), a worldwide collection of computers, Local area or Wide area networks, and gateways that currently use respective protocols (TCP/IP, Bluetooth, etc.) to communicate with one another. Other electronic device/computer network architectures are suitable.

Figure 5:
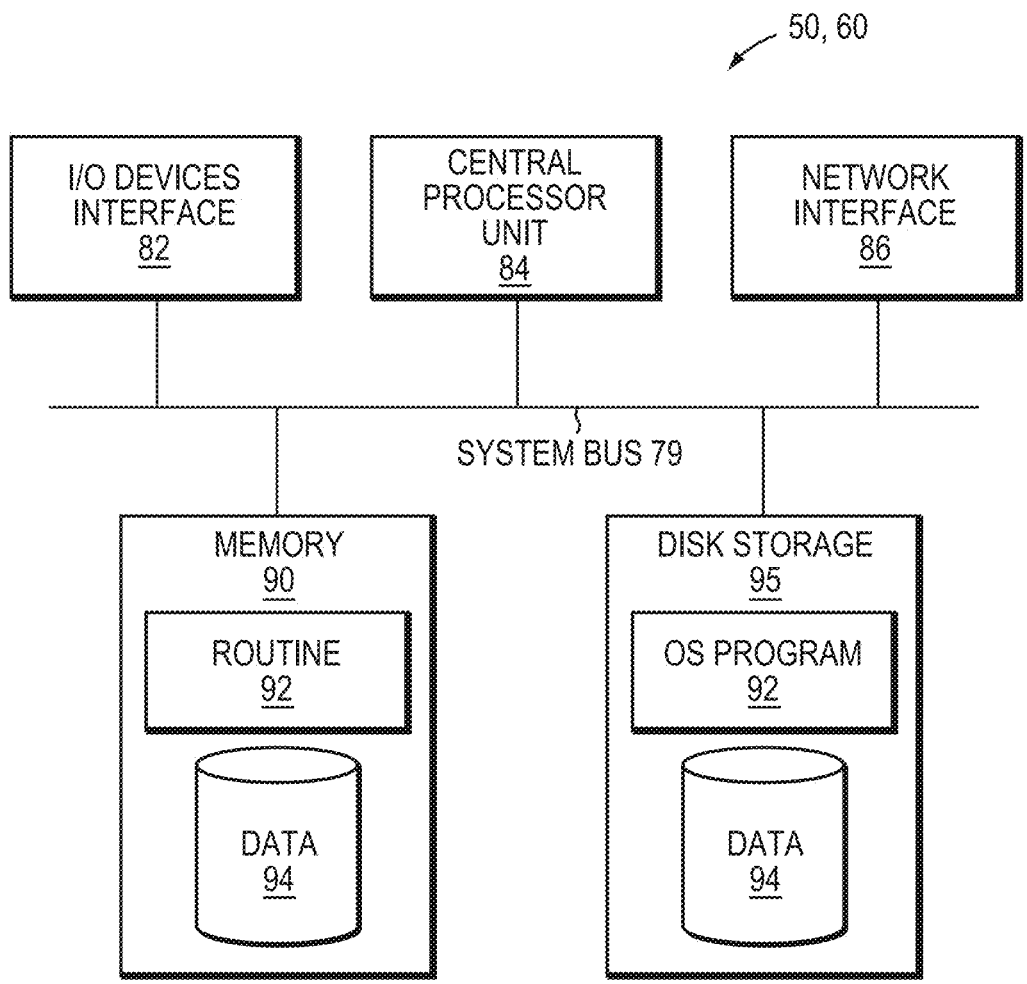
FIG. 5 is a diagram of the internal structure of a computer in the computer system of FIG. 4.

FIG. 5 is a diagram of the internal structure of a computer (e.g., client processor/device 50 or server computers 60) in the computer system of FIG. 4. Each computer 50, 60 contains system bus 79, where a bus is a set of hardware lines used for data transfer among the components of a computer or processing system. Bus 79 is essentially a shared conduit that connects different elements of a computer system (e.g., processor, disk storage, memory, input/ output ports, network ports, etc.) that enables the transfer of information between the elements. Attached to system bus 79 is I/O device interface 82 for connecting various input and output devices (e.g., keyboard, mouse, displays, printers, speakers, etc.) to the computer 50, 60. Network interface 86 allows the computer to connect to various other devices attached to a network (e.g., network 70 of FIG. 4). Memory 90 provides volatile storage for computer software instructions 92 and data 94 used to implement an embodiment of the present invention (e.g., correlation engine 80 and supporting code detailed above). Disk storage 95 provides non-volatile storage for computer software instructions 92 and data 94 used to implement an embodiment of the present invention. Central processor unit 84 is also attached to system bus 79 and provides for the execution of computer instructions.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 may be installed by any suitable software installation procedure, as is well known in the art. In another embodiment, at least a portion of the software instructions may also be downloaded over a cable, communication and/or wireless connection. In other embodiments, the invention programs are a computer program propagated signal product 107 embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 50 may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

Other advantages of the present invention are as follows.

Other advantages of the present invention include that process engineers may use modeling tools of the present invention to design, optimize and troubleshoot process manufacturing assets (plants, offshore assets, pipelines etc.). The modeling tools include rigorous, first principles models which capture the underlying physics and chemistry of the assets and are thus predictive. The modeling tools may be used to simulate behavior outside the normal operating range. In one embodiment of the invention, to use these models to troubleshoot and optimize the plant assets, first the model is adjusted to replicate the current plant operation, and thus understand the issue, then multiple scenarios are preferably simulated by adjusting model parameters and simulating the results. Finally, the scenario which resolves the issue is applied to the asset.

Benefits of the use of Web Sockets 222 include continuous traffic, two way communications, reduction of unnecessary network traffic and latency, and HTTP headers are reduced significantly, for example, by a factor of 500:1 compared with polling. Related advantages of the invention include but are not limited to: push notifications of notifications of Simulation Activities, Session Lifetime, and Smaller, Faster and Focused Messages.

The invention includes Scalable Vector Graphics (SVG). Benefits include Lightweight Textual Representation (not Binary), Open Standard, Infinitely Scalable, Styled with CSS3, DOM Entities with JavaScripting. Related advantages of the invention include but are not limited to: PFD Rendering, Pinch and Zoom, and GPU Support.

The invention supports Mobile Web Applications. Benefits include Offload UI computationally intensive tasks to GPU, Optimized to save battery life, Reach, Touch. Related advantages of the invention include but are not limited to: Access from Desktops (IE, Chrome), Access from new form factors—tablets (iPad), Easily Deployed, Easy to Use.

The invention supports standards including, but not limited to, ECMA Script 5 (aka Javascript), the DOM, Canvas, SVG and CSS3. Related advantages of using standards in the present invention include but are not limited to: a well-crafted infrastructure for development that includes not just web pages but applications, agreement among the largest browser providers such as Microsoft, Google and Apple, vendors eager to be compliant, and being closer to the "write once run anywhere" ideal. A related advantage of the present invention is that it supports and preferably uses "Single Page Applications" (SPAs). The present invention is not limited to any application, platform, or service.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method of managing data for at least one user comprising:

sensing actual real-time processing plant operation status data for at least one asset from a set of assets of a processing plant through at least one sensor;

recording, to a computer server, the actual real-time processing plant operation status data sensed from the at least one sensor;

performing a simulation, through at least one simulation model from a set of simulation models of a planned process design specification, through a computer-implemented simulation engine;

recording process design specification data from the simulation, through the computer-implemented simulation engine;

correlating the actual real-time processing plant operation status data and the process design specification data through a computer-implemented correlation engine, into a set of correlated data;

displaying the set of correlated data, to the at least one user through a computer display, such that the actual real-time processing plant operation status data and the process design specification data are streaming, and visually presented, concurrently, to the at least one user at the same time in a side-by-side manner; and displaying at least one set of further details of the set of correlated data, based upon interaction from the at least one user through a user interface, said displaying at least one set being by:
(i) locating at least one plant identifier within the actual real-time processing plant operation status data, when presented with a search command by the at least one user,
(ii) associating the at least one plant identifier to at least one simulation model variable of the at least one simulation model; and
(iii) displaying the at least one plant identifier together with the at least one simulation model variable and together with the at least one set of further details of the set of correlated data, wherein based on user selection, and over a user-specified time range, the displayed at least one set of further details of the set of correlated data includes real-time data or live data and zero or more of the following: time-averaged data, historical averaged data, trend data, and historical performance trend data.

2. The method of claim 1, wherein the actual real-time processing plant operation status data is used as feedback and provided to the at least one simulation model, thereby improving accuracy of the at least one simulation model.

3. The method of claim 1, wherein a plurality of scenarios may be simulated by adjusting model parameters of the at least one simulation model and further performing the simulation.

4. The method of claim 1, including a further step of:
applying a scenario, from a plurality of scenarios, to the set of assets, to resolve an issue.

5. The method of claim 1, wherein the at least one set of further details of correlated data includes, based on user selection, and over a user-specified time range, at least one of the following: a graph, a pictograph, a bar graph, a scatter plot, a pie graph, a histogram, a bar chart, a pie chart, a Gantt chart, a line cart, a candlestick chart, or a table.

6. The method of claim 1, wherein the actual real-time processing plant operation status data and the process design specification data are displayed together in a manner in which they share the same timeline, the same time scale, the same current time, and the same previous start time, and are displayed within a user-specified time range.

7. The method of claim 1, wherein the set of correlated data forms a plurality of sets of correlated data which are displayed concurrently with each other.

8. The method of claim 1, wherein the computer-implemented simulation engine and the at least one sensor are at different geographic locations, and the actual real-time processing plant operation status data and the process design specification data are linked through a computer network.

9. The method of claim 1, wherein planned estimates for the actual real-time processing plant operation status data are compared against actual results for the actual real-time processing plant operation status data.

10. The method of claim 1, wherein the computer display is implemented using a computer monitor, personal computer, laptop, desktop, phone, smart phone, mobile phone, projection device or other computer device.

11. The method of claim 1, wherein the at least one simulation model includes multiple versions, and multiple users may perform modifications to the at least one simulation model, where the modifications may be performed in either a shared or private manner, where the multiple users need not be in the same geographic location, and where the multiple versions may be saved and restored.

12. The method of claim 1, including the further steps of:
storing content in content storage, the content including user profile information, authentication information, and membership; and
allowing the at least one user to search, through a search service, for actual real-time processing plant operation status data and process design specification data.

13. The method of claim 12, further comprising:
extracting metadata, through the search service, from the at least one simulation model and the actual real-time processing plant operation status data, and indexing the extracted metadata into the search.

14. The method of claim 1, further comprising:
mapping the at least one plant identifier to the at least one simulation model variable based upon a user selection of the at least one plant identifier and the at least one simulation model.

15. The method of claim 1, further comprising:
retrieving the actual real-time processing plant operation status data from a live plant data service, and retrieving the process design specification data through an enterprise service bus based upon a granted request to a resource manager;
further correlating the retrieved actual real-time processing plant operation status data and the retrieved process design specification data through the computer-implemented correlation engine, into the set of correlated data; and
further displaying the set of correlated data, to the at least one user through the computer display, such that the retrieved actual real-time processing plant operation status data and the retrieved process design specification data are streaming, and visually presented, concurrently, to the at least one user at the same time in a side-by-side manner.

16. A computer system for use in managing data for at least one user, comprising the following computer-implemented elements:
at least one sensor that senses actual real-time processing plant operation status data for at least one asset from a set of assets of a processing plant;
a computer server that records the actual real-time processing plant operation status data sensed from the at least one sensor;
a computer-implemented simulation engine that performs a simulation, through at least one simulation model from a set of simulation models of a planned process design specification, and records process design specification data from the simulation;
a computer-implemented correlation engine that correlates the actual real-time processing plant operation status data and the process design specification data, into a set of correlated data;
a computer display that displays the set of correlated data, to the at least one user, such that the actual real-time processing plant operation status data and the process design specification data are streaming, and visually presented, concurrently, to the at least one user at the same time in a side-by-side manner; and
a user interface that the user interacts with, to display, through the computer display, at least one set of further details of the set of correlated data, wherein the computer-implemented correlation engine further:

locates at least one plant identifier, within the actual real-time processing plant operation status data, when presented with a search command by the at least one user;

associates the at least one plant identifier to at least one simulation model variable of the at least one simulation model; and displays the at least one plant identifier together with the at least one simulation model variable and together with the at least one set of further details of the set of correlated data, wherein based on user selection, and over a user-specified time range, the displayed at least one set of further details of the set of correlated data includes real-time data or live data and zero or more of the following: time-averaged data, historical averaged data, trend data, and historical performance trend data.

17. The computer system of claim 16, wherein the actual real-time processing plant operation status data is used as feedback and provided to the at least one simulation model, thereby improving accuracy of the at least one simulation model.

18. The computer system of claim 16, wherein the computer-implemented simulation engine simulates a plurality of scenarios by adjusting model parameters of the at least one simulation model and further performing the simulation.

19. The computer system of claim 16, wherein the computer-implemented simulation engine further:
applies a scenario, from a plurality of scenarios, to the set of assets, to resolve an issue.

20. The computer system of claim 16, wherein the at least one set of further details of the set of correlated data includes, based on user selection, and over a user-specified time range, at least one of the following: a graph, a pictograph, a bar graph, a scatter plot, a pie graph, a histogram, a bar chart, a pie chart, a Gantt chart, a line cart, a candlestick chart, or a table.

21. The computer system of claim 16, wherein the actual real-time processing plant operation status data and the process design specification data are displayed together in a manner in which they share the same timeline, the same time scale, the same current time, and the same previous start time, and are displayed within a user-specified time range.

22. The computer system of claim 16, wherein the set of correlated data forms a plurality of sets of correlated data which are displayed concurrently with each other.

23. The computer system of claim 16, wherein the computer-implemented simulation engine and the at least one sensor are at different geographic locations, and the actual real-time processing plant operation status data and the process design specification data are linked through a computer network.

24. The computer system of claim 16, wherein planned estimates for the actual real-time processing plant operation status data are compared against actual results for the actual real-time processing plant operation status data.

25. The computer system of claim 16, wherein the computer display is implemented using a computer monitor, personal computer, laptop, desktop, phone, smart phone, mobile phone, or other computer device.

26. The computer system of claim 16, wherein the at least one simulation model includes multiple versions, and multiple users may perform modifications to the at least one simulation model, where the modifications may be performed in either a shared or private manner, where the multiple users need not be in the same geographic location, and where the multiple versions may be saved and restored.

27. The computer system of claim 16, further comprises:
content storage storing content, the content including user profile information, authentication information, and membership data; and
the user interface allowing the at least one user to search, through a search service, for actual real-time processing plant operation status data and process design specification data.

28. A computer program product comprising:
one or more non-transitory computer-readable storage media having computer-executable components for use in managing information for a user, said components comprising:
at least one sensor that senses actual real-time processing plant operation status data for at least one asset from a set of assets of a processing plant;
a computer server that records the actual real-time processing plant operation status data sensed from the at least one sensor;
a computer-implemented simulation engine that performs a simulation, through at least one simulation model from a set of simulation models of a planned process design specification, and records process design specification data from the simulation;
a computer-implemented correlation engine that correlates the real-time processing plant operation status data and the process design specification data, into a set of correlated data;
a display driver that displays the set of correlated data, to the at least one user, such that the actual real-time processing plant operation status data and the process design specification data are streaming, and visually presented, concurrently, to the at least one user at the same time in a side-by-side manner; and
a user interface that the user interacts with, to display, through the computer display, at least one set of further details of the correlated data, wherein the computer-implemented correlation engine further:
locates at least one plant identifier, within the actual real-time processing plant operation status data, when presented with a search command by the at least one user;
associates the at least one plant identifier to at least one simulation model variable of the at least one simulation model; and
displays the at least one plant identifier together with the at least one simulation model variable and together with the at least one set of further details of the set of correlated data, wherein based on user selection, and over a user-specified time range, the displayed at least one set of further details of the set of correlated data includes real-time data or live data and zero or more of the following: time-averaged data, historical averaged data, trend data, and historical performance trend data.

* * * * *